United States Patent [19]
Clemens et al.

[11] Patent Number: 5,991,154
[45] Date of Patent: Nov. 23, 1999

[54] ATTACHMENT OF ELECTRONIC DEVICE PACKAGES TO HEAT SINKS

[75] Inventors: Donald L. Clemens, The Colony; Steven F. Edwards, Dallas, both of Tex.

[73] Assignee: Thermalloy, Inc., Dallas, Tex.

[21] Appl. No.: 09/228,775

[22] Filed: Jan. 6, 1999

Related U.S. Application Data

[63] Continuation-in-part of application No. 08/946,160, Oct. 7, 1997.

[51] Int. Cl.$^6$ .................................................. H05K 7/20
[52] U.S. Cl. ........................... 361/704; 361/707; 361/709; 361/712; 361/714; 361/719; 257/718; 257/719; 257/727; 174/16.3; 165/80.2; 165/80.3
[58] Field of Search .................................. 361/690, 704, 361/707, 709, 710, 717–719; 257/718, 719, 727; 174/16.3; 165/80.2, 80.3

[56] References Cited

U.S. PATENT DOCUMENTS

| | | | |
|---|---|---|---|
| 4,544,942 | 10/1985 | McCarthy | 174/16.3 |
| 4,609,040 | 9/1986 | Moore | 165/80.3 |

*Primary Examiner*—Leo P. Picard
*Assistant Examiner*—Boris L. Chervinsky
*Attorney, Agent, or Firm*—Jack A. Kanz

[57] ABSTRACT

A heat sink having a support base which supports a base plate is used to mount one or more device packages on a circuit board or the like. The support base is adapted to be secured to the circuit board. The base plate has opposed major faces adapted for mating with device packages. Tongues or clips secure individual device packages on the major faces of the base plate independently to that device packages may be removeably attached to either or both sides of the base plate.

19 Claims, 3 Drawing Sheets

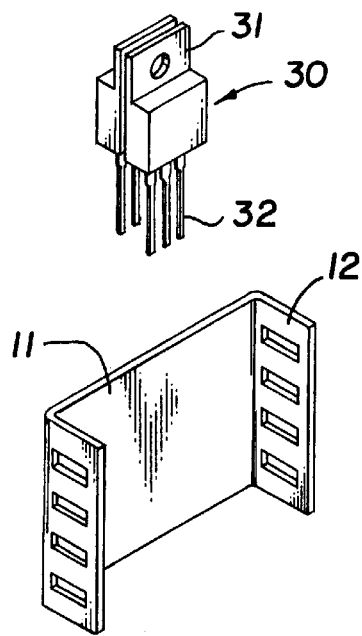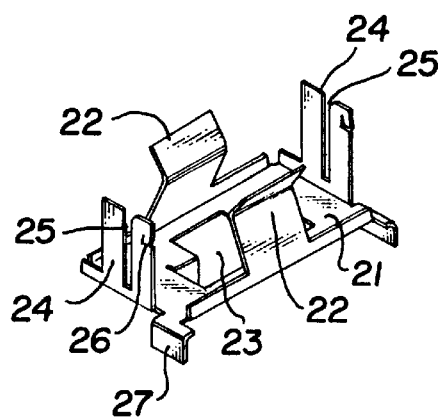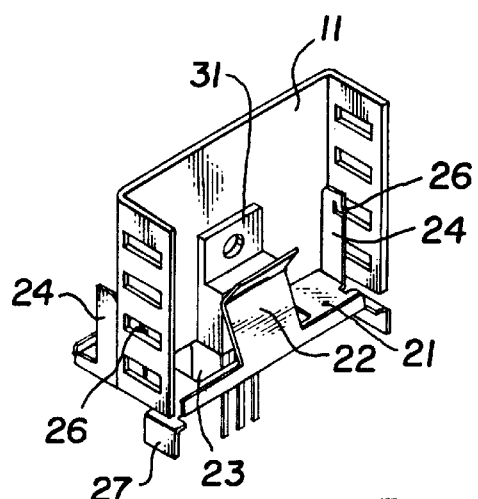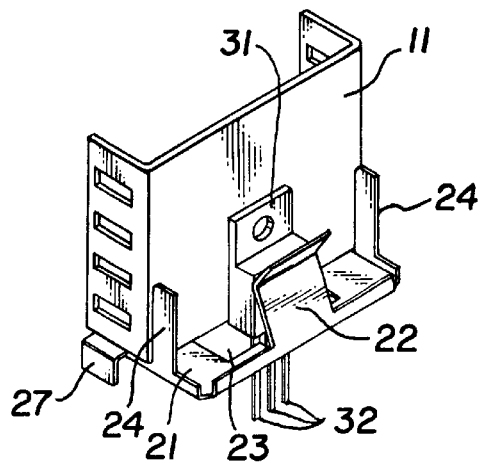
Fig. 5
Fig. 6

ATTACHMENT OF ELECTRONIC DEVICE PACKAGES TO HEAT SINKS

This is a continuation-in-part of application Ser. No. 08/946,160 filed Oct. 7, 1997 entitled Attachment of Electronic Packages To Heat Sinks.

This invention relates to assemblies of electronic device packages and heat sinks. More particularly, it relates to securing one or more electronic device packages to a heat sink body and mounting the assembly on a circuit board or the like.

Many electronic device packages are designed to conduct heat from the circuit device chip contained therein to a surface of the package. Typically, one face of the package is formed by a plastic, ceramic or metal body which acts as a heat transfer medium to conduct heat from the electronic device to an external surface of the package. External heat dissipating means such as a heat sink must be positioned in thermal communication with the heat transfer medium to absorb the heat and/or dissipate it into the surrounding environment. The heat sink may be a body of metal or the like which has a relatively high thermal conductivity suitably shaped to dissipate the energy by convection, conduction or radiation. Typically, the heat sink is a body of aluminum or aluminum alloy shaped to exhibit a high surface area in the form of fins, pins or the like so that heat is readily dissipated therefrom.

The device package may be secured to the heat sink with adhesives and/or mechanical means such as screws or the like. Spring clip tongues and the like are also used where ease of attachment and removal are a consideration. Most spring clips, however, are an integral part of the heat sink, thus requiring each heat sink to be uniquely shaped to accommodate each particular device package.

When mounting device packages on circuit boards and the like, care must be taken to insure that those packages which require heat sinks are matched with the appropriate heat sink and that the heat sink is positioned on the board so as to permit proper heat dissipation. In many cases, the heat sink is itself attached to the circuit board to insure stability of the assembly and, in some cases, to aid in conduction of heat from the device packages. Accordingly, a vast number of sizes, styles and shapes of heat sinks, each of which accommodates only a single or a relatively few device packages, must be designed, fabricated and inventoried by board assemblers.

The present invention provides methods and apparatus for assembling device packages on heat sinks and mounting the assembly on a circuit board or the like employing a heat sink plate with attachment fingers or tongues on opposite sides thereof. This assembly permits attachment of device packages to either or both sides of the heat sink plate, thus increasing the density of device package population on the board. The heat sink plate of the assembly is rigidly fixed with respect to the clip tongues. Accordingly, both sides of the heat sink plate need not be populated. The heat sink assembly may therefore be used to support device packages on either or both sides, the attachment of device packages on one side being totally independent of attachment of device packages on the other side.

In the preferred embodiment the heat sink comprises a mounting base adapted for attachment to a circuit board or the like and a heat sink plate adapted to be mounted on the mounting base. The configuration, size, etc., of the heat sink plate (as well as the mounting base) may vary as required to dissipate heat from the particular number and heat dissipating requirements of the electronic device packages. Since the mounting base and heat sink plate are formed separately, one or a few mounting bases may be designed which accommodate a wide variety of heat sink plates. Thus the appropriate heat sink plate may be selected as determined by heat dissipation requirements and directly inserted into a common or universal mounting base. Since the clip fingers or tongues operate independently on opposite sides of the heat sink plate, a wide variety of different sizes, shapes and numbers of packages may be mounted on one or both sides of the plate. Since the heat sink plate is a separate component mounted in a standard or universal mounting base, a wide variety of heat sink plates and device packages may be mounted on circuit boards using a minimum number of or even a single universal standard mounting base. Other features and advantages of the invention will become more readily understood from the following detailed description taken in connection with the appended claims and attached drawing in which:

FIG. 5 is an exploded front perspective view of an assembly of heat sink components and device packages in accordance with the invention;

FIG. 6 is a back perspective view of the assembly of FIG. 5;

Figure 1:
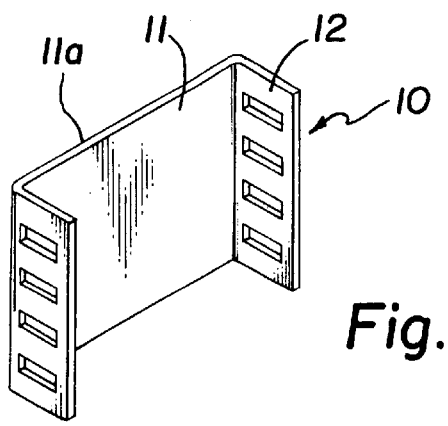
FIG. 1 is a perspective view of one embodiment of the heat sink plate of a heat sink assembly used in the presently preferred embodiment of the invention.

Throughout the several views of the drawing like numerals are used to indicate like parts. The drawing figures are not to scale but are intended to disclose the inventive concepts by illustration and are incorporated herein to illustrate presently preferred embodiments of the invention. The drawing should not be construed as limiting the invention to the illustrated and/or described embodiments.

The embodiment illustrated in FIGS. 1–6 comprises a mounting base 20 which supports a heat sink plate 10 (See FIGS. 1–4). The heat sink plate 10 has opposed major faces 11, 11a and includes a plurality of heat dissipating fins 12 or the like. Heat sink plate 10 may be formed by stamping sheet stock or otherwise formed to provide a large surface area for dissipating heat. The size and shape of the plate 10 is determined, of course, by the heat dissipation requirements, size, etc., of the electronic device packages to be mounted thereon. Obviously the size, shape, configuration, etc., of heat sink plate 10 may vary as desired or required.

Figure 2:
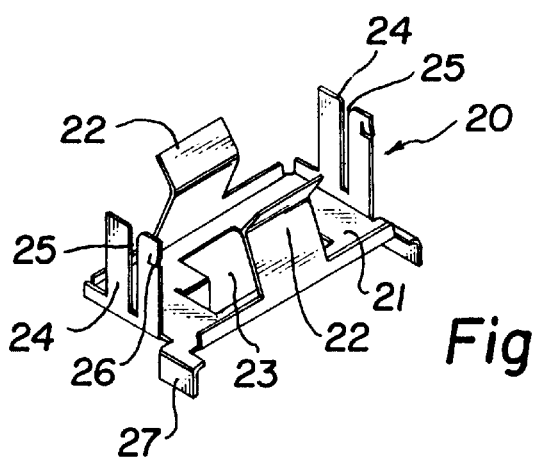
FIG. 2 is a perspective view of one embodiment of a mounting base for the heat sink plate of FIG. 1.
Figure 3:
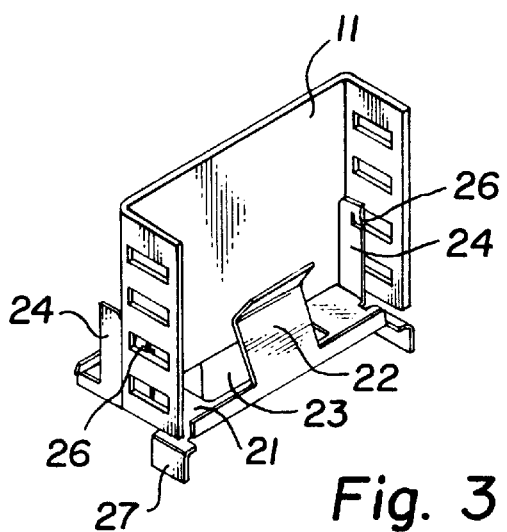
FIG. 3 is a front perspective view of the assembly of FIGS. 1 and 2.
Figure 4:
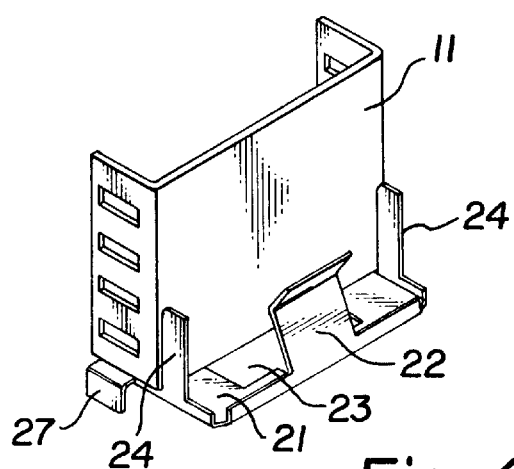
FIG. 4 is a back perspective view of the assembly of FIG. 3.

Mounting base 20 comprises a base portion 21 which supports upwardly projecting tongues 22 and tabs 24. In the preferred embodiment the mounting base 20 is also formed from sheet metal stock but may be fabricated otherwise. The upwardly extending tabs 24 each include a slot 25 adapted to receive heat sink plate 10 as shown in FIG. 3. The mounting base 20 preferably includes a base portion 21 which extends substantially in a first plane with tabs 24 extending therefrom in a direction substantially perpendicular to the first plane as shown in FIG. 2.

In the embodiments illustrated the heat sink plate 10 is inserted into slots 25 in tabs 24 so that major faces 11, 11*a* are disposed perpendicular to the plane of base portion 21 of mounting base 20. If desired, one or more of the tabs 24 may include a detent 26 (see FIGS. 2 and 3) adapted to mate with an edge of a fin 12 or a notch or the like in the plate 10 and thereby securely and rigidly lock the heat sink plate in slot 25.

The mounting base 20 supports a pair of oppositely disposed upwardly projecting tongues 22 which are arranged on opposite sides of the tabs 24 and thus on opposite sides of the heat sink plate 10. The mounting base 20 also includes an aperture 23 in base portion 21 so that the leads of a device package mounted adjacent the faces 11, 11*a* may project through mounting base 20 as shown in FIGS. 5 and 6. The mounting base 20 also includes a plurality of feet 27 extending in the direction opposite tabs 24. Feet 27 are adapted to be inserted into appropriate apertures in a circuit board or the like to secure the assembly to the circuit board.

As shown in FIGS. 5 and 6 a device package may be inserted between face 11 and tongue 22 and secured therein with the thermal transfer plate 31 in intimate thermal communication with the face 11 of heat sink plate 10.

It should be noted that each of tongues 22 operates independently of the other. Since heat sink plate 10 is a rigid plate and is rigidly secured to mounting base 20, the tongues 22 operate totally independently of each other. Thus, device packages (such as package 30) may be mounted on either side or both sides of the base plate 10.

Figure 8:
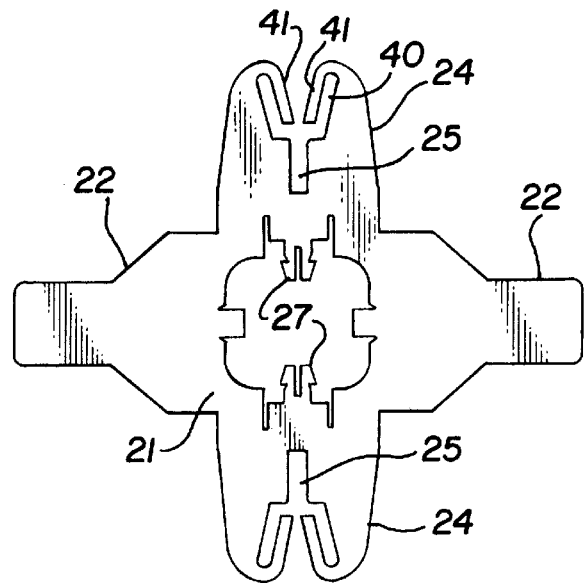
FIG. 8 is a top plan view of a flat cut-out blank used to form the mounting base of FIG. 7.
Figure 9:
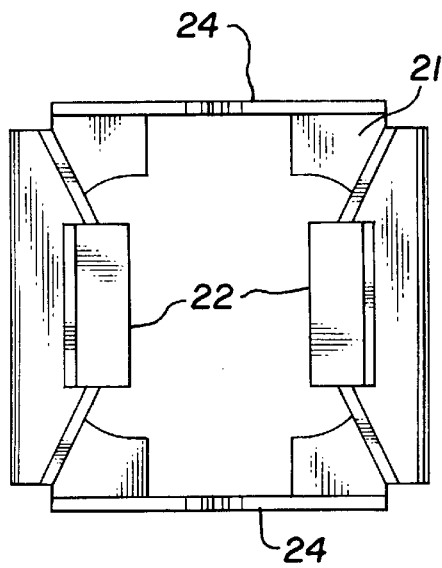
FIG. 9 is a top plan view of the mounting base of FIG. 7.
Figure 7:
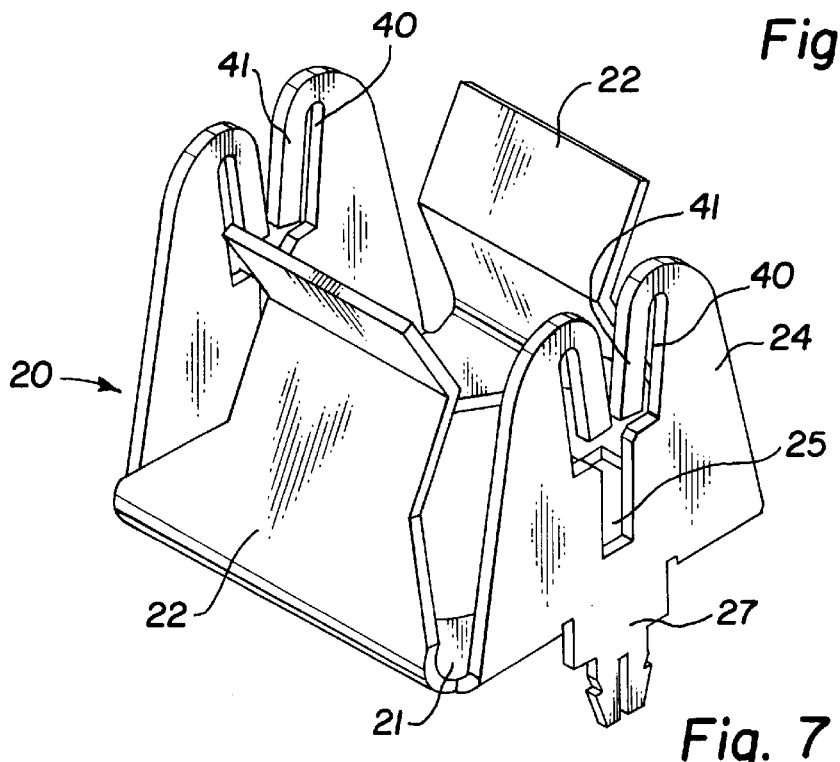
FIG. 7 is a perspective view of an alternative embodiment of a mounting base for heat sink plates such as shown in FIG. 1.

In the embodiment shown in FIGS. 7, 8 and 9 the mounting base 20 is cut from a flat sheet of metal (such as aluminum, aluminum alloy or the like) in the symmetric pattern shown in FIG. 8. The pattern comprises a base portion 21 with a large central aperture 23 with tongues 22 diametrically opposed on two sides thereof and tabs 24 diametrically opposed on the other two sides. Feet 27 extend inwardly into the aperture 23. As shown in FIGS. 7 and 9 tabs 24 are folded parallel with each other (perpendicular to base portion 21) so that a heat sink plate 10 may be supported therein. It should be noted that when tabs 24 are folded upwardly, feet 27 (which form extensions of tabs 24) are aligned to extend in the opposite direction from base portion 21.

Opposed tongues 22 are folded slightly toward each other and crimped to act as levers which urge electronic device packages into intimate contact with opposite side of the heat sink plate 10 supported by the base support.

In the embodiment of FIGS. 7, 8 and 9 a slot 25 is formed in each tab 24. The slots 25 are aligned to extend parallel with each other and vertically from base portion 21. Each slot 25 includes a tributary slot 40 (two of which are shown on each slot 25 in FIGS. 7–9). Each tributary slot extends substantially parallel with the open end of slot 25 and joins slot 25 at a point removed from the open end to define a finger 41 which extends inwardly toward the centerline of slot 25. The free end of finger 41 is deformed to extend toward the vertical plane of the slot 25 (or the closed end of slot 25 may be wider than the open end of slot 25) so that the free end of finger 41 will firmly engage a heat sink plate 10 inserted into the slot 25. In the embodiment illustrated in FIGS. 7, 8 and 9 fingers 41 are formed in opposite sides of the open end of slot 25 and the space between the free ends of fingers 41 is less than the thickness of the heat sink plate 10 to be inserted therein. Thus, insertion of the plate 10 into slot 25 requires slight compression of the fingers 41 so that fingers 41 firmly grasp the plate 10. The fingers 41 are preferably aligned at a slight incline with respect to the centerline of slot 25 so that the free ends of fingers 41 engage the sides of the plate 10 and act as barbs to prevent (or retard) withdrawal of the plate 10 from slot 25. This arrangement permits firm rigid assembly of the parts without using bolts, welding, etc.

In the embodiments illustrated each electronic device package 30 is mounted vertically with its leads 32 extending parallel with faces 11, 11*a* and extending through aperture 23 so that the entire assembly may be manually or automatically assembled on a circuit board or the like. The assembly of a device package (or packages) and heat sink is thus readily handled as a single unit and placed on a circuit board (manually or robotically) so that the leads 32 and feet 27 project into suitable apertures in the board. The heat sink may thus be soldered to the board in the same soldering operation with the electronic device leads. After the assembly is mounted on the board, the device package 30 may be removed without removing the heat sink from the circuit board by simply melting the solder attaching leads 32 and withdrawing the package 30 vertically. The assembly thus permits relatively easy replacement of device packages.

Since the heat sink plate 10 is arranged vertically with respect to base portion 21 and base portion 21 has a large aperture 23 therein, device packages may be inserted from below base portion 21 as well as from above. Such arrangements permit robotic assembly of the heat sink and device package assembly.

While the invention has been described with particular reference to heat sink assemblies comprised of two components stamped from sheet metal stock, the invention is not so limited. The heat sink may, for example, be assembled from multiple moldings or machined components or may be molded, machined, stamped or otherwise formed as a monolithic unit. Similarly, the spring fingers or tongues 22 may take any form or shape. For example, they may be in the form of flexible fingers or permanent slots, flanges, bosses or the like which align and/or secure the device package to the heat sink plate. While only one tongue 22 is shown on each side of the assembly, multiple tongues or tongues capable of holding one or more device packages may be employed on each side of the heat sink plate. Furthermore, the tongues 22 may be formed as part of the heat sink plate 10 rather than the mounting base 20.

Although the invention has been shown and described with specific reference to assemblies for mounting in holes in circuit boards or the like, the invention is not so limited. For example, feet 27 may be adapted for surface mounting by simply forming feet 27 with horizontally extending faces. The electronic device packages may likewise be adapted for surface mounting without departing from the principles of the invention.

It will be readily recognized that the materials used for manufacture of the heat sink mounting assembly of the invention may be varied as desired, depending on the application. Similarly, the physical size and shape of the components may be varied to accommodate various sizes, shapes, requirements, etc., of various device packages. For example, while the heat sink plate and its mounting base are separate components as described above, the shape and size of the heat sink plate may be varied as required to accommodate various energy dissipation requirements. Different sizes, shapes, etc., of heat sink plates may designed to be used with a single size or shape of mounting base.

From the foregoing it will be recognized that the principles of the invention may be employed in various arrangements to obtain the benefit of the many advantages and features disclosed. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed:

1. Apparatus for mounting electronic device packages on circuit boards or the like comprising:
   (a) a rigid heat sink plate having oppositely disposed first and second major faces;
   (b) a unitary monolithic mounting base formed of thermally conductive material including
      (i) a base portion extending substantially in a first plane and supporting said heat sink plate with said first and second major faces substantially perpendicular to said first plane; and
      (ii) at least one mounting foot formed from and extending from said base portion to secure said base portion to a circuit board or the like;
   (c) an aperture in said base portion aligned with said first and second major faces of said heat sink sufficiently large to permit passage of an electronic device package therethrough in the direction of at least one of said first and second major faces; and
   (d) at least one tongue positioned opposite each major face and adapted to urge an electronic device package into contact with one of said first and second major faces.

2. Apparatus as defined in claim 1 wherein said mounting base includes tabs extending therefrom in a direction substantially perpendicular to said first plane.

3. Apparatus as defined in claim 2 wherein said tabs include slots and said heat sink plate is secured in said slots aligning said first and second major faces substantially perpendicular to said first plane.

4. Apparatus as defined in claim 2 wherein said tabs include detents mating with said heat sink plate for securing sad heat sink plate to said mounting base.

5. Apparatus as defined in claim 2 wherein said mounting base supports at least two tongues extending therefrom in a direction substantially perpendicular to said first plane.

6. Apparatus as defined in claim 2 wherein said mounting base includes feet adapted to be soldered to a circuit board or the like.

7. Apparatus as defined in claim 3 wherein said tabs include at least one finger extending into one of said slots.

8. Apparatus as defined in claim 7 wherein said finger inclines toward the centerline of said slot.

9. Apparatus for mounting electronic device packages comprising:
   (a) a unitary mounting base of substantially thermally conductive material having a base portion extending substantially in a first plane with an aperture therein sufficiently large to pass an electronic device package therethrough;
   (b) a pair of tabs, each having a longitudinal slot therein, extending from said base portion in a direction substantially perpendicular to said first plane;
   (c) a substantially thermally conductive heat sink plate having first and second oppositely disposed major faces mounted in the slots in said tabs substantially perpendicular to said first plane and in alignment with said aperture; and
   (d) at least one tongue positioned opposite each said major face and adapted to urge an electronic device package into intimate contact with said major face.

10. Apparatus as defined in claim 9 wherein at least one of said tabs includes a finger extending into the slot therein.

11. Apparatus as defined in claim 9 wherein said finger extends inwardly toward the centerline of said slot.

12. Apparatus as defined in claim 9 wherein said mounting base has feet extending therefrom for securing said mounting base to a circuit board or the like.

13. Apparatus as defined in claim 10 wherein at least one of said tabs includes detent means for securing said heat sink to said mounting base.

14. In combination:
   (a) a heat sink comprising:
      (i) a unitary mounting base of substantially thermally conductive material having a base portion extending substantially in a first plane with an aperture therein sufficiently large to pass an electronic device package therethrough;
      (ii) a substantially thermally conductive heat sink plate having first and second oppositely disposed major faces; and
      (iii) at least one tongue positioned opposite each said major face and adapted to urge an electronic device package into intimate contact with said major face; and
   (b) an electronic device package secured between one of said tongues and a major face of said heat sink plate.

15. The combination defined in claim 14 wherein said electronic device package has leads extending therefrom and said electronic device package is aligned so that said leads project through said aperture.

16. Apparatus for mounting electronic device packages on circuit boards or the like comprising
   (a) a rigid heat sink plate having oppositely disposed first and second major faces; and
   (b) a unitary mounting base form of sheet metal including
      (i) a base portion extending substantially in a first plane and having a substantially central aperture therein;
      (ii) a pair of tabs extending substantially parallel with each other on opposite sides of said aperture in a direction substantially perpendicular to said first plane, each tab having a slot thereon having an open end and a closed end adapted for supporting said heat sink plate substantially perpendicular to said first plane; and
      (iii) a pair of tongues extending substantially parallel with each other and parallel with said tabs and adapted to urge an electronic device package into contact with said rigid heat sink plate.

17. Apparatus as defined in claim 16 including feet extending from said mounting base for solderably securing said mounting base to a circuit board or the like.

18. Apparatus as defined in claim 16 including at least one finger extending from one of said tabs into said slot in said tab.

19. Apparatus as defined in claim 18 wherein said finger projects inwardly toward the centerline of said slot and toward-the-closed end of said slot.

* * * * *